(12) United States Patent
Pressel et al.

(10) Patent No.: US 7,858,440 B2
(45) Date of Patent: Dec. 28, 2010

(54) STACKED SEMICONDUCTOR CHIPS

(75) Inventors: Klaus Pressel, Regensburg (DE);
Gottfried Beer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 595 days.

(21) Appl. No.: 11/859,346

(22) Filed: Sep. 21, 2007

(65) Prior Publication Data

US 2009/0079090 A1    Mar. 26, 2009

(51) Int. Cl.
H01L 21/00 (2006.01)
H01L 21/44 (2006.01)
H01L 23/02 (2006.01)
H01L 23/48 (2006.01)
H01L 23/52 (2006.01)
H01L 29/40 (2006.01)

(52) U.S. Cl. .................. 438/109; 438/613; 257/686; 257/777; 257/E21.499; 257/E23.179

(58) Field of Classification Search ............ 438/613, 438/109, 107; 257/686, 738, 693, 666, 777, 257/E21.499, E21.509, E21.504, E21.502, 257/E23.023, E23.179, E23.069, E23.07, 257/E23.003
See application file for complete search history.

(56) References Cited

U.S. PATENT DOCUMENTS

| 2003/0112610 | A1* | 6/2003 | Frankowsky et al. | 361/760 |
| 2003/0203540 | A1* | 10/2003 | Hur | 438/111 |
| 2004/0036164 | A1 | 2/2004 | Koike et al. | |

FOREIGN PATENT DOCUMENTS

EP    1801866 A2    6/2007

OTHER PUBLICATIONS

Amkor Technology, Amkor Confidental/Proprietary Business Information, Sep. 2005, CSCAN.
"Embedded Wafer Level Ball Grid Array (eWLB)", M. Brunnbauer, et al., 2006 Electronics Packaging Technology Conference, 2006 IEEE.
"Neo-Stacking Technology", Keith D. Gann, Irvine Sensors Corporation, published in the Dec. 1999 issue of HDI Magazine, 1999 Miller Freeman, Inc.

* cited by examiner

*Primary Examiner*—Walter L Lindsay, Jr.
(74) *Attorney, Agent, or Firm*—Dicke, Billig & Czaja, PLLC

(57) ABSTRACT

Stacked semiconductor chips are disclosed. One embodiment provides an array of first semiconductor chips, covering the array of the first semiconductor chips with a mold material, and placing an array of second semiconductor chips over the array of the first semiconductor chips. The thicknesses of the second semiconductor chips is reduced. The array of the first semiconductor chips are singulated by dividing the mold material.

27 Claims, 11 Drawing Sheets

STACKED SEMICONDUCTOR CHIPS

BACKGROUND

This invention relates to devices including stacked semiconductor chips and methods to make a device including stacked semiconductor chips.

For high system integration it is useful to stack integrated circuits, sensors, micromechanical apparatuses or other modules on top of each other. The more modules are stacked on top of each other, the more the thickness of the stack increases. In some applications, the maximum thickness of the stack may be restricted.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1A:
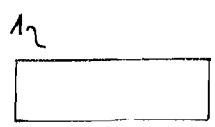
FIGS. 1A to 1F schematically illustrate a method to produce devices 100 as an exemplary embodiment.
Figure 1A:
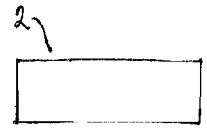
Figure 1B:
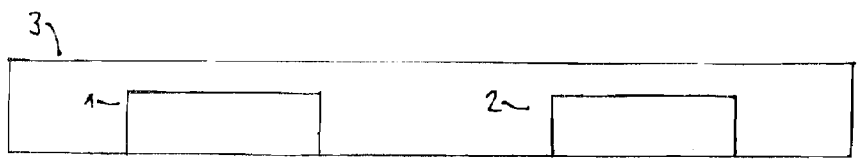

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with semiconductor chips embedded in a mold material are described below. The semiconductor chips may be of extremely different types, may be manufactured by different technologies and may include for example, integrated electrical or electro-optical circuits or passives. The integrated circuits may, for example, be designed as logic integrated circuits, analog integrated circuits, mixed signal integrated circuits, power integrated circuits, memory circuits or integrated passives. Furthermore, the semiconductor chips may be configured as MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, microphones etc. The semiconductor chips may be configured as antennas and/or discrete passives and/or chip stacks. The semiconductor chips may also include antennas and/or discrete passives. Semiconductor chips in which such functional elements are embedded generally contain electronic circuits which serve for driving the functional elements or further process signals generated by the functional elements. The semiconductor chips need not be manufactured from specific semiconductor material and, furthermore, may contain inorganic and/or organic materials that are not semiconductors, such as for example, discrete passives, antennas, insulators, plastics or metals. Moreover, the semiconductor chips may be packaged or unpackaged.

The semiconductor chips have contact pads which allow electrical contact to be made with the semiconductor chips. The contact pads may be composed of any desired electrically conductive material, for example, of a metal, such as aluminum, nickel, palladium, gold or copper, a metal alloy, a metal stack or an electrically conductive organic material. The contact pads may be situated on the active main surfaces of the semiconductor chips or on other surfaces of the semiconductor chips.

One or more electrically conductive layers may be applied to the semiconductor chips. The electrically conductive layers may be used as wiring layers to make electrical contact with the semiconductor chips from outside the devices or to make electrical contact with other semiconductor chips and/or components contained in the devices. The electrically conductive layers may be manufactured with any desired geometric shape and any desired material composition. The electrically conductive layers may, for example, be composed of conductor tracks, but may also be in the form of a layer covering an area. Any desired electrically conductive materials, such as metals, for example, aluminum, nickel, palladium, silver, tin, gold or copper, metal alloys, metal stacks or organic conductors, may be used as the material. The electrically conductive layers need not be homogenous or manufactured from just one material, that is to say various compositions and concentrations of the materials contained in the electrically conductive layers are possible. Furthermore, the electrically conductive layers may be arranged above or below or between dielectric layers.

The devices described in the following include a mold material covering at least parts of the semiconductor chips. The mold material may be any appropriate duroplastic, thermoplastic, laminate (prepreg) or thermosetting material and may contain isolating filler materials and/or in special cases electrically conductive fillers. Various techniques may be employed to cover the semiconductor chips with the mold material, for example, compression molding, lamination or injection molding.

Figure 1C:
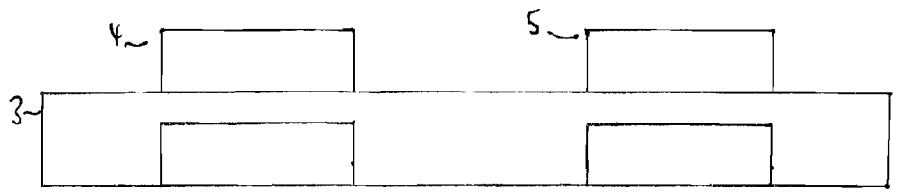
Figure 1D:
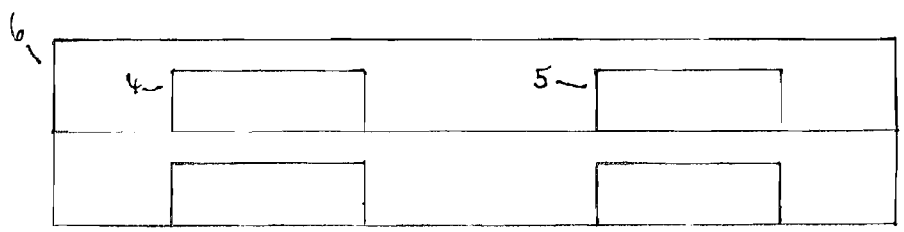
Figure 1E:
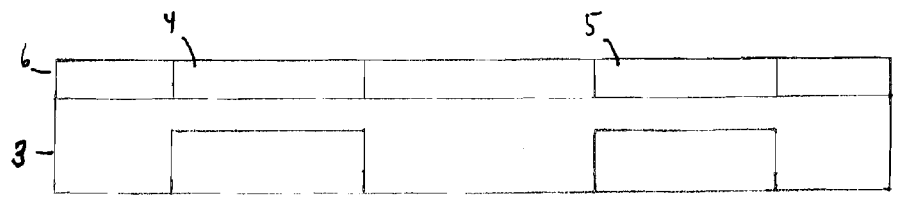
Figure 1F:
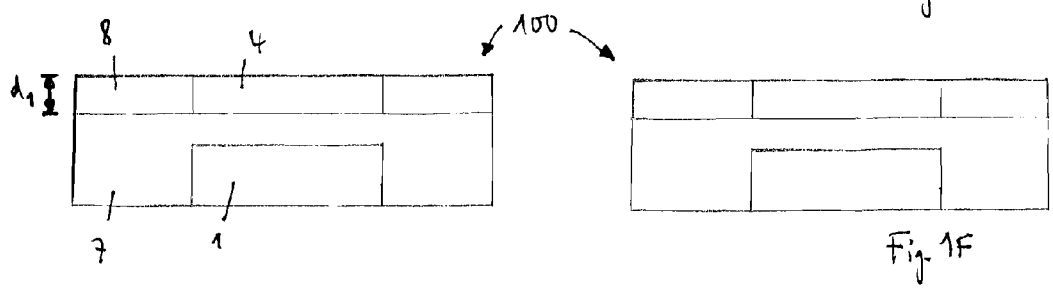

FIGS. 1A to 1F schematically illustrate a method for production of devices 100. Firstly, an array of first semiconductor chips is provided. In FIG. 1A, first semiconductor chips 1 and 2 of the array of the first semiconductor chips are illustrated. The array may contain further first semiconductor chips. The semiconductor chips 1 and 2 are covered with a mold material 3 (see FIG. 1B). Then an array of second semiconductor chips is placed over the semiconductor chips 1 and 2. FIG. 1C illustrates two semiconductor chips 4 and 5 of the array of the second semiconductor chips. The array of the second semiconductor chips may contain further second semiconductor chips. The semiconductor chips 4 and 5 may also be covered with a mold material 6 (see FIG. 1D). The mold material 6 is then partly removed, for example, by grinding, until the thicknesses of the semiconductor chips 4 and 5 are reduced (see FIG. 1E). The semiconductor chips 1 and 2 are then singulated by dividing the mold materials 3 and 6 (see FIG. 1F).

Cross sections of the devices 100 obtained by the method described above are illustrated in FIG. 1F. The device 100 includes a first layer 7 of mold material holding the semiconductor chip 1 and a second layer 8 of mold material holding the semiconductor chip 4. The upper surface of the second layer 8 of mold material is flush with the upper surface of the semiconductor chip 4. Thus, these surfaces form a common plane. This plane may differ from a mathematical plane and may have some micro-processes in the range up to 10 μm and may be warped. The thickness of the semiconductor chip 4, which is denoted by $d_1$ in FIG. 1F, may, for example, be smaller than 200 μm and in particular smaller than 150 μm.

Figure 2A:
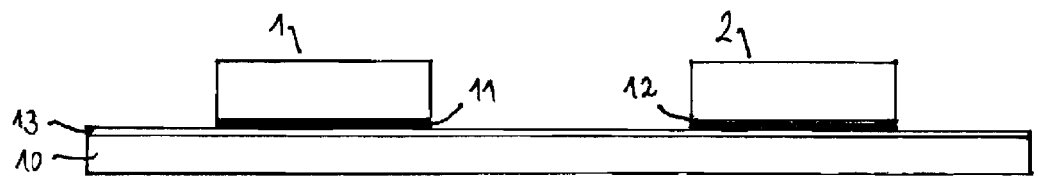
FIGS. 2A to 2N schematically illustrate a method to produce devices 200 as a further exemplary embodiment.
Figure 2B:
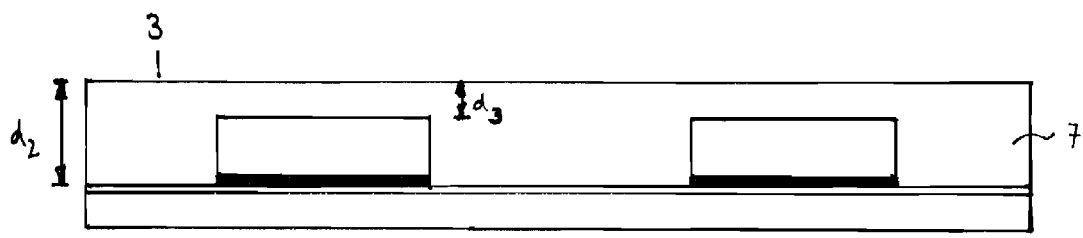
Figure 2C:
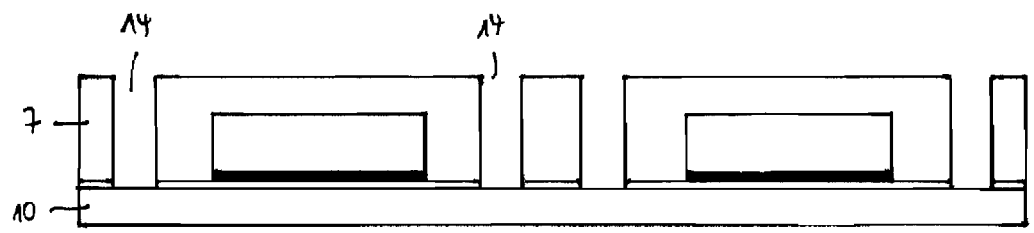
Figure 2D:
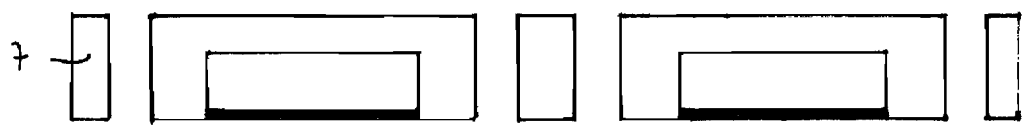
Figure 2E:
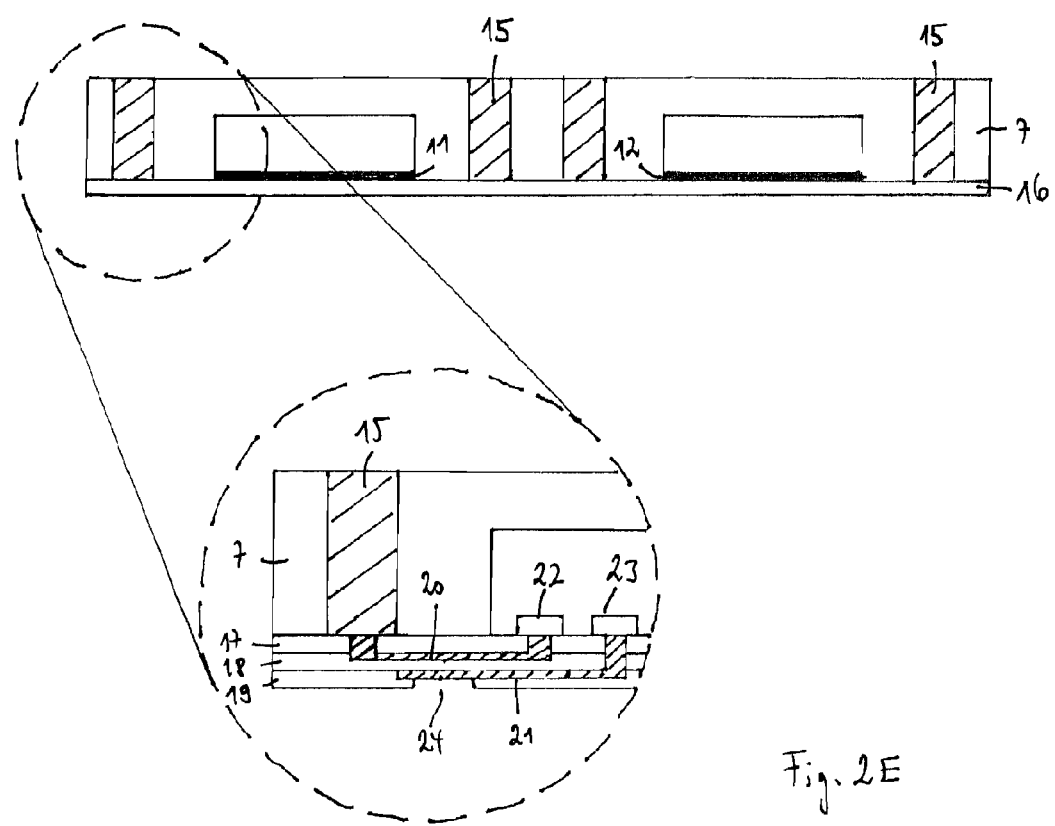
Figure 2F:
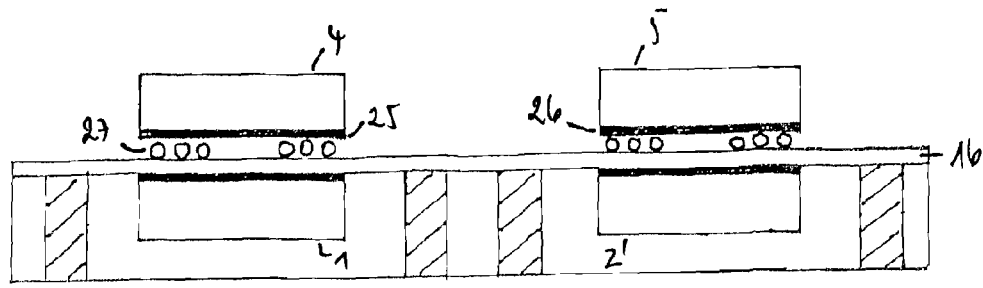
Figure 2G:
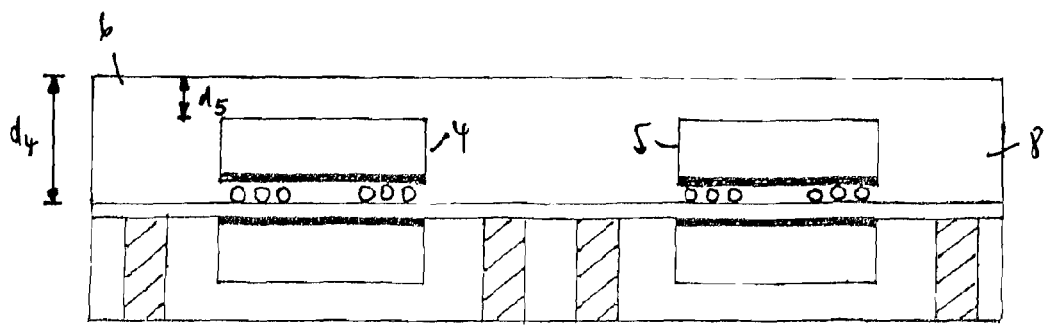
Figure 2H:
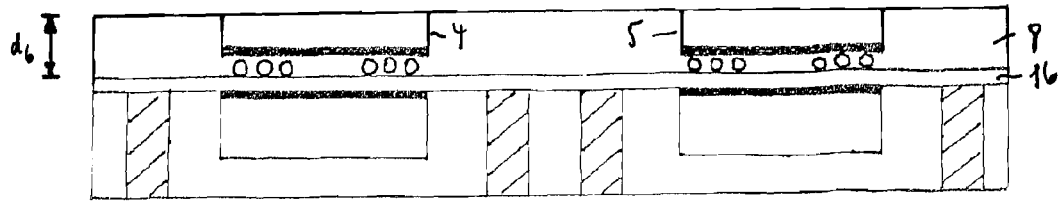
Figure 2I:
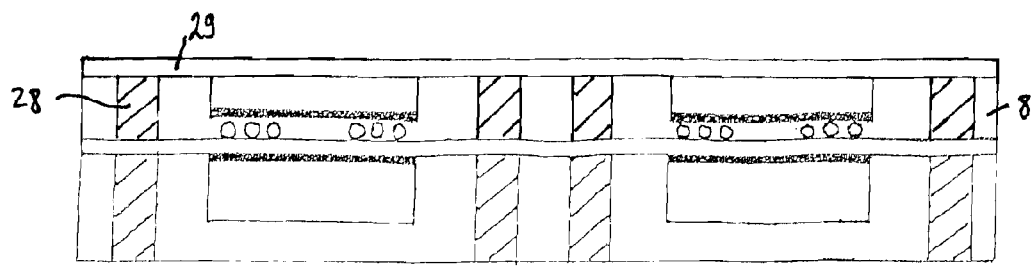
Figure 2J:
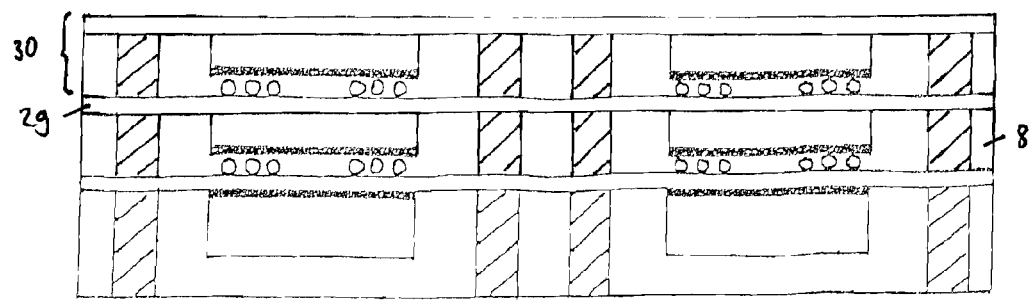
Figure 2K:
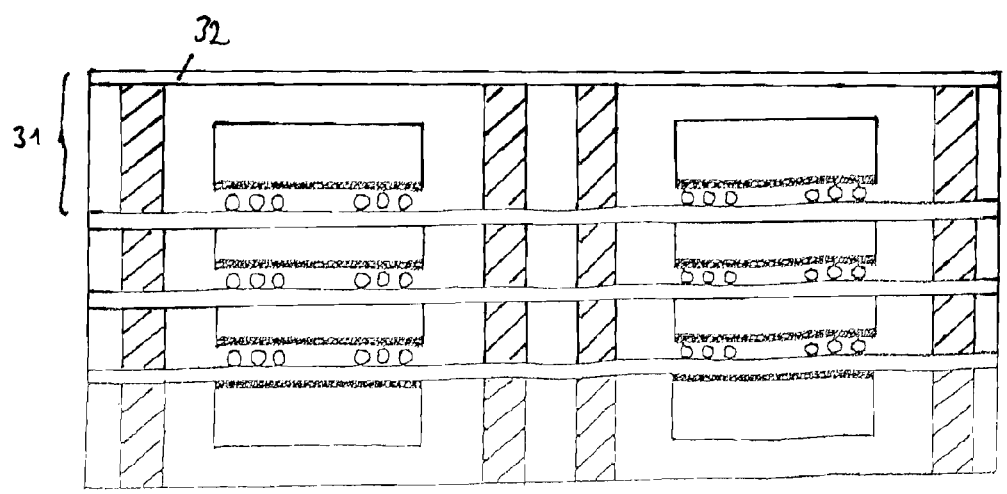
Figure 2L:
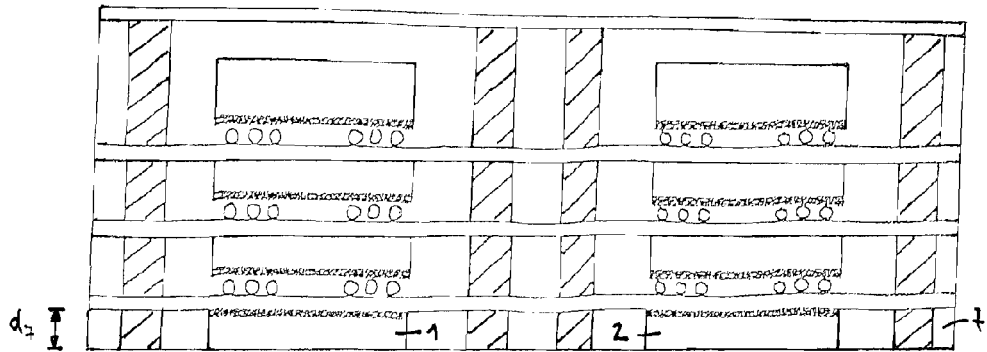
Figure 2M:
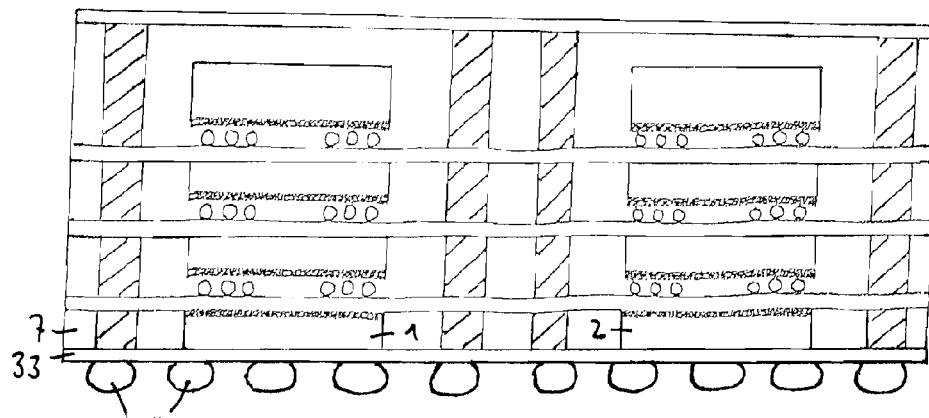
Figure 2N:
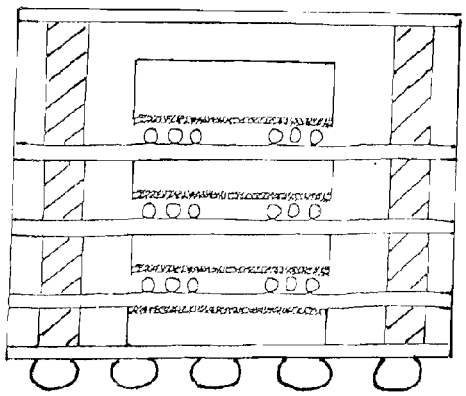
Figure 2N:
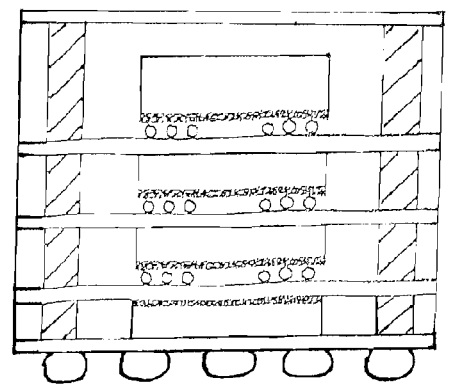

FIGS. 2A to 2N schematically illustrate a method for production of devices 200, cross sections of which are illustrated in FIG. 2N. The method illustrated in FIGS. 2A to 2N is a development of the method illustrated in FIGS. 1A to 1F. The details of the production method that are described below can therefore be likewise applied to the method of FIGS. 1A to 1F.

As illustrated in FIG. 2A, the semiconductor chips 1 and 2 as well as possibly further semiconductor chips are placed over a carrier 10. The carrier 10 may be a plate made of a rigid material, for example, a metal, such as nickel, steel or stainless steel, laminate, film or a material stack. The carrier 10 has a flat surface on which the semiconductor chips 1 and 2 are placed. The shape of the carrier 10 is not limited to any geometric shape, for example, the carrier 10 may be round or square-shaped. Furthermore, the carrier 10 may have any size and any suitable array of first semiconductor chips may be placed on the carrier 10 (only two of the first semiconductor chips are illustrated in FIG. 2A).

The semiconductor chips 1 and 2 as well as all other semiconductor chips described herein may have been fabricated on a wafer made of semiconductor material. After dicing the wafer and thereby separating the individual semiconductor chips 1 and 2, the semiconductor chips 1 and 2 are relocated on the carrier 10 in larger spacing as they have been in the wafer bond. The semiconductor chips 1 and 2 may have been manufactured on the same wafer, but may have been manufactured on different wafers. Furthermore, the semiconductor chips 1 and 2 may be physically identical, but may also contain different integrated circuits and/or represent other components. The semiconductor chips 1 and 2 have active main surfaces 11 and 12, respectively, and may be arranged over the carrier 10 with their active main surfaces 11 and 12 facing the carrier 10.

Before the semiconductor chips 1 and 2 are placed over the carrier 10, an adhesive tape 13, for example, a double sided sticky tape, may be laminated onto the carrier 10. The semiconductor chips 1 and 2 can be fixed on the adhesive tape 13. For attaching the semiconductor chips 1 and 2 to the carrier 10, other kinds of attaching materials may be used.

After the semiconductor chips 1 and 2 have been mounted on the carrier 10, they are encapsulated by, for example, molding using a duroplastic or thermosetting mold material 3 thereby forming the first layer 7 of mold material (see FIG. 2B). The gaps between the semiconductor chips 1 and 2 are also filled with the mold material 3. The mold material 3 may be based on an epoxy material and may contain a filling material consisting of small particles of glass ($SiO_2$) or other electrically insulating mineral filler materials like $Al_2O_3$ or organic filler materials. In special cases, the filler material may consist of electrically conductive particles which is described further below. The thickness $d_2$ of the first layer 7 of mold material may be in the range from 300 to 1500 μm and in one embodiment, in the range from 400 to 600 μm. The thickness $d_2$ may also depend on the thickness of the semiconductor chips 1 and 2. The mold material 3 covering the top surfaces of the semiconductor chips 1 and 2 may have a thickness $d_3$ greater than 100 μm.

As illustrated in FIG. 2C, through-holes 4 may be formed in the first layer 7 of mold material. The through-holes 14 may reach from the top surface of the first layer 7 of mold material down to the surface of the carrier 10. Thus, the through-holes 14 may extend through the adhesive tape 13. The through-holes 14 may be drilled using a laser beam, an etching method or any other appropriate method. Other embodiments to the through-holes 14 will be given further below. The aspect ratio of the through-holes 14, which is the ratio of their widths to their lengths, may be in the range from 1:1 to 1:10 and in one embodiment, from 1:2 to 1:3. The widths of the through-holes 14 may be in the range from 50 to 200 μm. The through-holes 14 may be spaced apart from each other in the range from 100 to 600 μm, but other spacings are also possible.

The semiconductor chips 1 and 2 covered with the first layer 7 of mold material are released from the carrier 10, and the adhesive tape 13 is pealed from the semiconductor chips 1 and 2 as well as from the first layer 7 of mold material (see FIG. 2D). The adhesive tape 13 may feature thermo-release properties, which allow the removal of the adhesive tape 13 during a heat-treatment. The removal of the adhesive tape 13 from the carrier 10 is carried out at an appropriate temperature, which depends on the thermo-release properties of the adhesive tape 13 and is usually higher than 150° C.

Before or after the release of the first layer 7 of mold material from the carrier 10 and the adhesive tape 13, the through-holes 14 may be filled with an electrically conductive material, which may be a metal, such as copper, aluminum or gold, or a metal alloy, such as SnAg, SnAu or any solder material or any electrically conductive paste. The electrically conductive material forms through-connections 15 in the first layer 7 of mold material (see FIG. 2E). A method for production of the through-connections 15 provides that the through-holes 14 are not completely filled with an electrically conductive material, but only the walls of the through-holes 14 are coated with an electrically conductive material. For example, a seed layer, such as a palladium layer or metal complexes, is first deposited onto the surfaces of the through-holes 14. Then a layer of copper may be electroless deposited onto the seed layer. This copper layer may have a thickness of less than 1 μm. Afterwards another layer of copper is galvanically deposited, which may have a thickness of more than 5 μm. The electroless copper deposition may also be omitted. In another embodiment, the electrically conductive material may be sputtered onto the surfaces of the through-holes 14. For example, first a layer of titanium having a thickness of, for example, about 50 nm and afterwards a layer of copper having a thickness of, for example, about 200 nm are sputtered. The copper layer may then be used as a seed layer to galvanically deposit a further copper layer having a thickness of for example, more than 5 μm.

It may be provided that an electrically insulating material, such as epoxy, is filled into the through-holes 14 coated with the electrically conductive layers. The electrically insulating material may protect the electrically conductive layers against corrosion.

After the release of the carrier 10 and the adhesive tape 13 the active main surfaces 11 and 12 of the semiconductor chips 1 and 2 as well as the bottom surface of the first layer 7 of mold material form a common planar surface. As illustrated in FIG. 2E, a redistribution layer 16 is applied to this surface.

In order to illustrate the structure and the function of the redistribution layer 16, a part of the redistribution layer 16 is enlarged in FIG. 2E. In the present embodiment, the redistribution layer 16 includes three dielectric layers 17, 18 and 19 as well as two electrically conductive layers in the form of wiring layers 20 and 21. The dielectric layer 17 is deposited on the planar surface formed by the main surfaces 11 and 12 of the semiconductor chips 1 and 2 and the first layer 7 of mold material. The wiring layer 20 is applied to the dielectric layer 17, with an electrical contact being produced between a contact pad 22 that is embedded in the active main surface 11 and the wiring layer 20 at one point and a further electrical contact between the through-connection 15 and the wiring layer 20 at another point. The dielectric layer 17 has openings in order to produce these contacts.

The dielectric layer 18, the wiring layer 21 and the dielectric layer 19 are subsequently applied to the dielectric layer 17 and the wiring layer 20. The dielectric layers 17 and 18 have openings in order to allow an electrical contact between a contact pad 23 embedded in the active main surface 11 and the wiring layer 21 to be made. The dielectric layer 21 is opened in areas where contact pads 24 are arranged. The contact pads 24 may be used to electrically couple the semiconductor chips 1 and 2 to other components internal or external of the devices 200. Instead of two wiring layers, it is also possible to use only one wiring layer or, more than two wiring layers if required. The structures of other redistribution layers described herein may be similar to the structure of the redistribution layer 16.

The dielectric layers 17 to 19 may be fabricated in various ways. For example, the dielectric layers 17 to 19 can be deposited from a gas phase or from a solution, or can be laminated onto the semiconductor chips 1 and 2. Furthermore, thin-film technology methods can be used for application of the dielectric layers 17 to 19. Each of the dielectric layers 17 to 19 may be up to 10 µm thick. In order to make electrical contacts with the wiring layers 20 and 21, the dielectric layers 17 to 19 may, for example, be opened by using photolithographic methods and/or etching methods. The wiring layers 20 and 21 may, for example, be fabricated by using metallization followed by structuring of the metallization layer in order to form the conductor tracks of the wiring layers.

The wiring layers 20 and 21 may also be generated galvanically. For that, usually a seed layer, for example, a palladium layer, is deposited first, which may be carried out electroless or by using an ink jet printing technique. The seed layer can then be used as an electrode for the galvanic deposition of a further electrically conductive layer. Furthermore, the wiring layer 20 and the electrically conductive layers coating the surfaces of the through-holes 14 may be generated at the same time.

Another technique that may be employed to generated the wiring layers 20 and 21 is laser direct structuring. In case of laser direct structuring an electrically insulating polymer foil is placed onto the first layer 7 of mold material and the active main surfaces 11 and 12. The circuit definition is done by using a laser beam, which activates special additives in the polymer foil in order to allow subsequent selective plating. Another possibility is a redistribution layer processing as it is used for "fan-in wafer-level packages".

The first layer 7 of mold material allows the redistribution layer 16 to extend beyond the semiconductor chips 1 and 2. The contact pads 24 therefore do not need to be arranged in the area of the semiconductor chips 1 and 2 but can be distributed over a larger area. The increased area which is available for arrangement of the contact pads 24 as a result of the first layer 7 of mold material means that the contact pads 24 can not only be arranged at a great distance from one another, but that the maximum number of contact pads 24 which can be arranged there is likewise increased compared to the situation when all the contact pads 24 are arranged within the area of the active main surfaces 11 and 12 of the semiconductor chips 1 and 2.

The through-connections 15 allow the redistribution layer 16 to be electrically contacted from the opposite side of the first layer 7 of mold material. The through-connections 15, which are also called vias, may also be fabricated by placing electrically conductive structures on the carrier 10 and covering these structures with the mold material 3 at the same time when the semiconductor chips 1 and 2 are covered with the mold material 3. If these structures have electrically insulating side walls, a mold compound with an electrically conductive filler may be used. Furthermore, structures made of materials, which can be dissolved by water or other solvents, may be integrated into the first layer 7 of mold material. These structures can be dissolved afterwards thereby creating the through-holes 14, in which the through-connections 15 may then be formed. Furthermore, the through-holes 14 and the through-connections 15 may be fabricated after the release of the first layer 7 of mold material from the carrier 10 and before or after the application of the redistribution layer 16.

After the fabrication of the redistribution layer 16 the semiconductor chips 4 and 5 may be placed on the redistribution layer 16 with their active main surfaces 25 and 26 facing the redistribution layer 16 (see FIG. 2F). The semiconductor chips 4 and 5 may be electrically connected to the contact pads 24 of the redistribution layer 16 by solder deposits 27, for example, microballs having a diameter in the range between 30 and 80 µm. The solder deposits 27 establish electrical connections between the upper semiconductor chips 4 and 5 and the lower semiconductor chips 1 and 2. The solder material may be formed from metal alloys which are composed, for example, from the following materials: SnPb, SnAg, SnAgCu, SnAgCuNi, SnAu, SnCu and SnBi. Instead of the solder deposits 27, other connecting techniques may be used, such as for example, diffusion soldering or adhesive bonding by using an electrically conductive adhesive.

The semiconductor chips 4 and 5 are then covered with the mold material 6 (see FIG. 2G) thereby creating the second layer 8 of mold material. The mold material 6 may be identical to the mold material 3 used to fabricate the first layer 7 of mold material. The thickness $d_4$ of the second layer 8 of mold material may be in the range from 200 to 1000 µm and in one embodiment, in the range from 400 to 600 µm. The mold material 6 covering the top of the semiconductor chips 4 and 5 may have a thickness $d_5$ greater than 100 µm.

The second layer 8 of mold material is then thinned (see FIG. 2H). Grinding machines may be used that are similar or identical to the machines used for semiconductor wafer grinding. In one embodiment, etching may be used to reduce the thickness of the second layer 8 of mold material. In this case, an etching material should be used etching the mold material 6 and the semiconductor chips 4 and 5 with the same etching rate.

Thinning is carried out until the thicknesses of the semiconductor chips 4 and 5 are also reduced. After the grinding a damage etching process may be performed to remove transition and crack zones caused by grinding. At the end, the second layer 8 of mold material may have a thickness $d_6$ of less than 200 µm or less than 100 µm. The thickness of the second layer 8 of mold material with the semiconductor chips 4 and 5 is typically not smaller than 50 μm after thinning, but may also be smaller than that. As a result of the thinning, the surface of the second layer 8 of mold material facing away from the redistribution layer 16 is flush with the top surfaces of the semiconductor chips 4 and 5. The term "flush" is here not meant mathematically and may include micro-processes in the range up to 10 μm. Thus, the upper surfaces of the second layer 8 of mold material and the semiconductor chips 4 and 5 form a common planar surface as described before.

As illustrated in FIG. 2I, through-connections 28 may be generated in the second layer 8 of mold material and a redistribution layer 29 may be formed on top of the second layer 8 of the mold material. The through-connections 28 and the redistribution layer 29 may have the same or similar features and may be manufactured in the same or a similar way as the through-connections 15 formed in the first layer 7 of mold material and the redistribution layer 16, respectively.

Subsequently, further layers containing semiconductor chips, mold material, through-connections and redistribution layers may be stacked on the redistribution layer 29. In FIG. 2J such an additional layer 30 is depicted. In case of the layer 30, the mold material and the semiconductor chips have been thinned in a way as illustrated in FIG. 2H. It is to be noted that the semiconductor chips in the layer 30 may have totally different functions than the semiconductor chips 1 and 2 and the through-connections of the layer 30 are not necessarily situated directly above the through-connections arranged in the second layer 8 of mold material. The through-connections of the layer 30 may also be shifted away from the through-connections of the underlying layer. This also applies to the through-connections of all other layers described herein. Furthermore, the redistribution layer of the layer 30 may have a totally different routing than the redistribution layers 16 and 29.

FIG. 2K illustrates a further layer 31 which has been stacked on the layer 30. In case of the layer 31, the mold material has not been thinned. The layer 31 is the top layer of the devices 200. In FIG. 2K the layer 31 includes a redistribution layer 32, which may be used to stack other devices on top of the devices 200 and/or may be prepared for package-on-package assembly. In case such a stacking is not desired, the redistribution layer 32 may also be omitted. Furthermore, the mold material and the semiconductor chips of the layer 31 may also be thinned.

As illustrated in FIG. 2L, the first layer 7 of mold material and the semiconductor chips 1 and 2 may also be thinned, for example, by grinding. After grinding and damage etching, the first layer 7 of mold material may have a thickness $d_7$ in the range between 50 and 200 μm, but may also be smaller than that.

Subsequently, a further redistribution layer 33 may be attached to the common planar surface of the first layer 7 of mold material and the semiconductor chips 1 and 2 formed by the thinning (see FIG. 2M). In this arrangement the through-connections may be produced after thinning and before applying the redistribution layer 33. Moreover, solder deposits 34 may be placed onto the contact pads of the redistribution layer 33. The solder deposits 34 may be applied to the redistribution layer 33 by "ball placement", in which pre-shaped balls 34 composed of solder material are applied to the external contact pads. As an alternative to "ball placement", the solder deposits 34 may, for example, be applied by using stencil printing with a solder paste, followed by a heat-treatment process. The solder deposits 34 may be used to electrically couple the devices 200 to other components, for example, a PCB (Printed Circuit Board).

As illustrated in FIG. 2N, the devices 200 are separated from one another by separation of the mold material layers and the redistribution layers, for example, by sawing or a laser beam.

It is obvious to a person skilled in the art that the stacked devices 200 illustrated in FIG. 2N are only intended to be an exemplary embodiment, and many variations are possible. For example, semiconductor chips or passives of different types may be included in the same device 200. The semiconductor chips and passives may differ in function, size, manufacturing technology etc. Furthermore, each layer may represent totally different functions, and the through-connections of one layer do not need to be in line with the through-connections of the neighboring layers. Moreover, the number of layers within the devices 200 ranges from 2 to an unlimited number.

During production, it may be provided that the layers with the semiconductor chips are tested before the next layer of semiconductor chips is stacked on top of a layer. If one or more (or too many) components of a layer are found to be inoperative, the complete layer (for example, layer 30) may be ground off and replayed by a new one. Furthermore, if a semiconductor chip is found to be defective, another semiconductor chip having the same function may be applied over the defective semiconductor chip in order to replace the defective semiconductor chip.

In one embodiment, no further semiconductor chips may be placed over a defective semiconductor chip and the device containing the defective chip may be discarded.

The manufacturing method illustrated in FIGS. 2A to 2N may ensure on the one hand that during production the mold material is robust enough to prevent bending or breaking of the mold material. In case of the first layer 7 of mold material, this layer may be manufactured with a sufficient thickness. When later on other layers of mold material are stacked on top of the first layer 7 of mold material, these layers ensure the robustness of the stacked layers so that it is possible to reduce the thickness of the first layer 7 of mold material. On the other hand, thinning of the mold material and the semiconductor chips results in a reduced overall thickness of the devices 200. This makes it possible to use the devices 200 for applications where reduced dimensions are required.

Figure 3A:
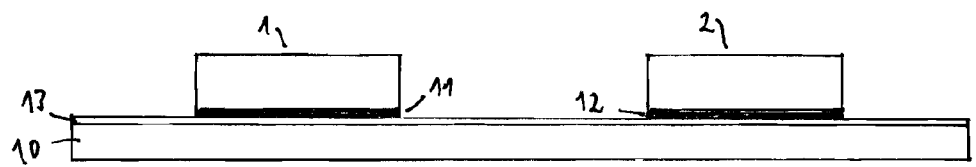
FIGS. 3A to 3N schematically illustrate a method to produce devices 300 as a further exemplary embodiment.
Figure 3B:
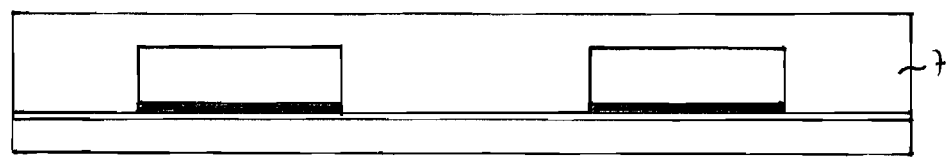
Figure 3C:
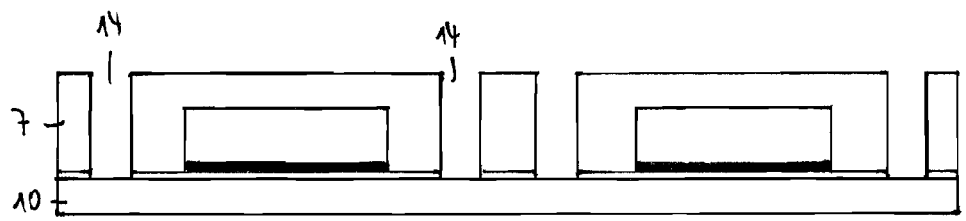
Figure 3D:
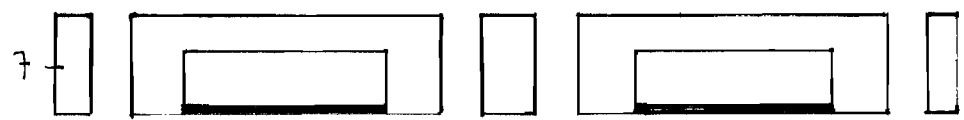
Figure 3E:
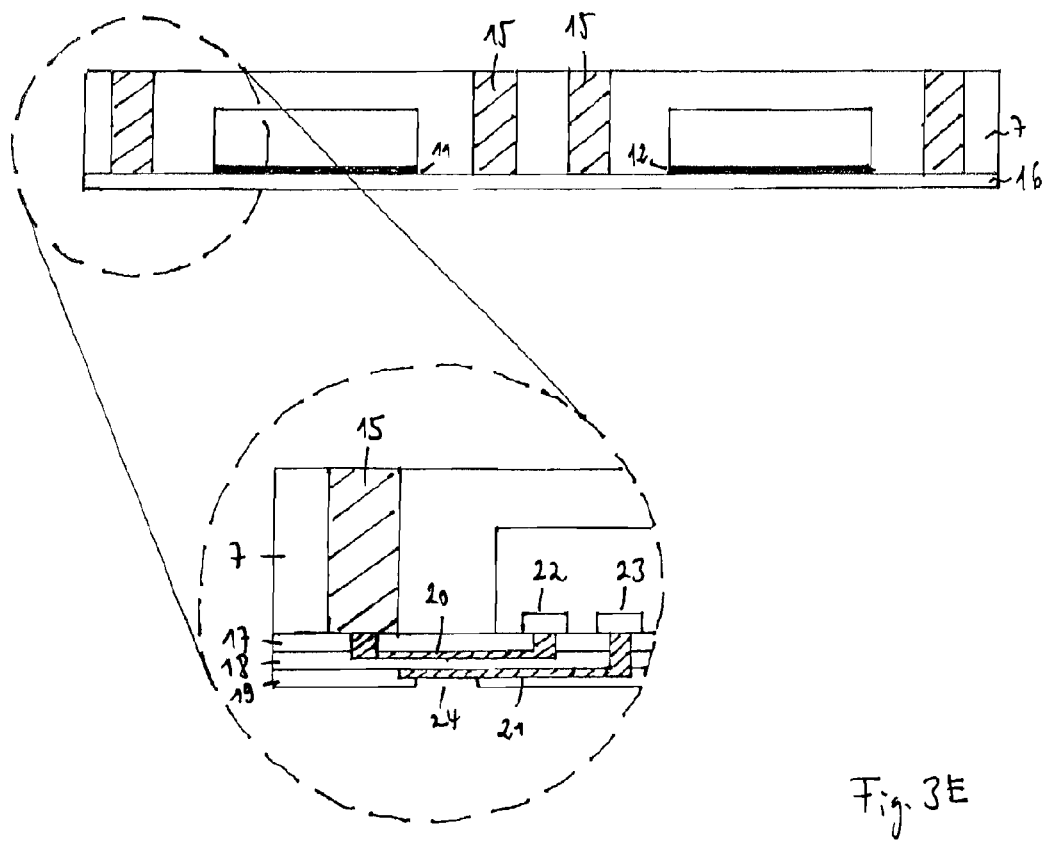
Figure 3F:
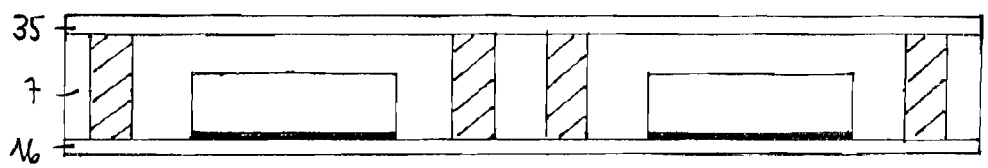
Figure 3G:
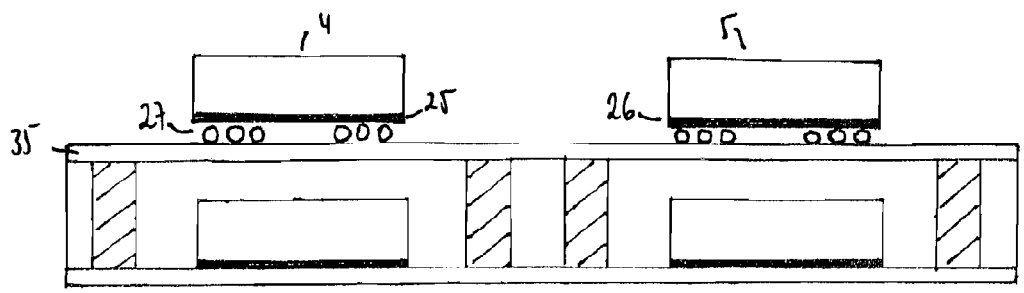
Figure 3H:
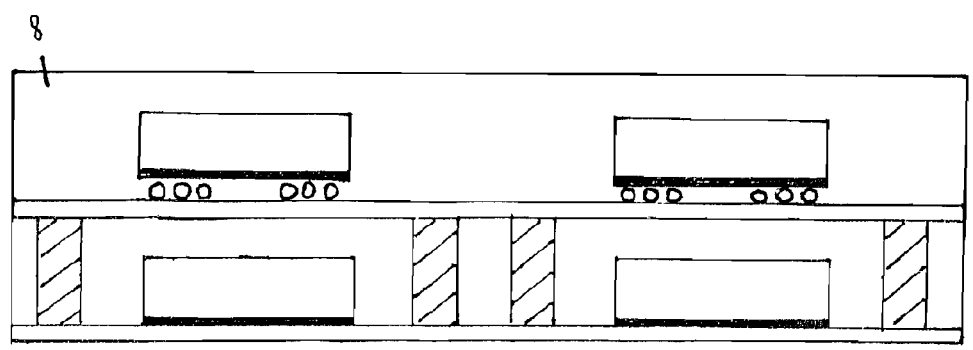
Figure 3I:
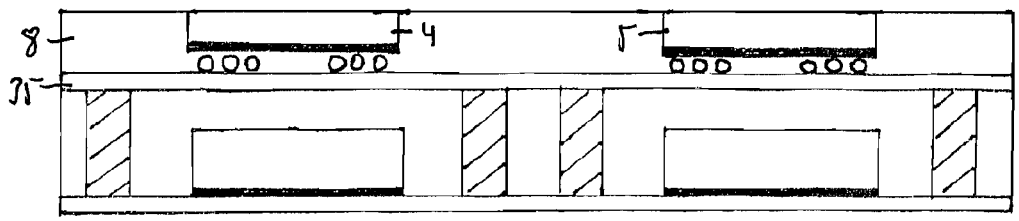
Figure 3J:
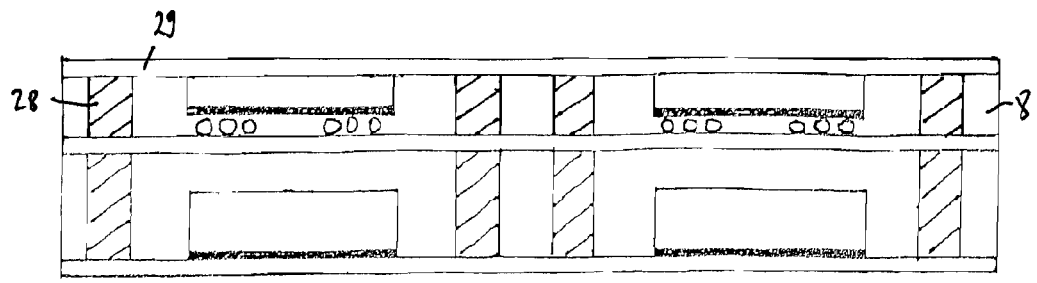
Figure 3K:
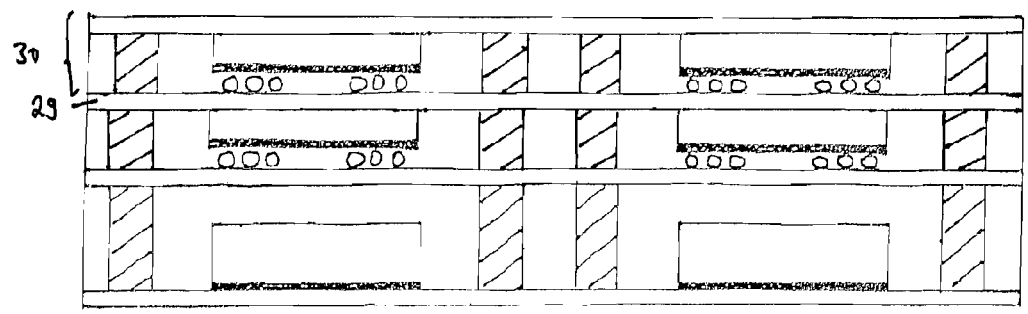
Figure 3L:
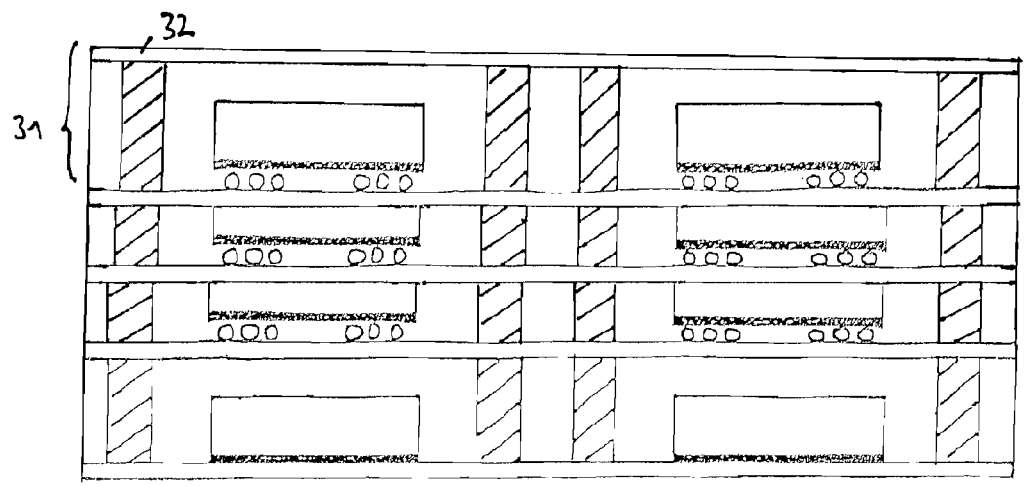
Figure 3M:
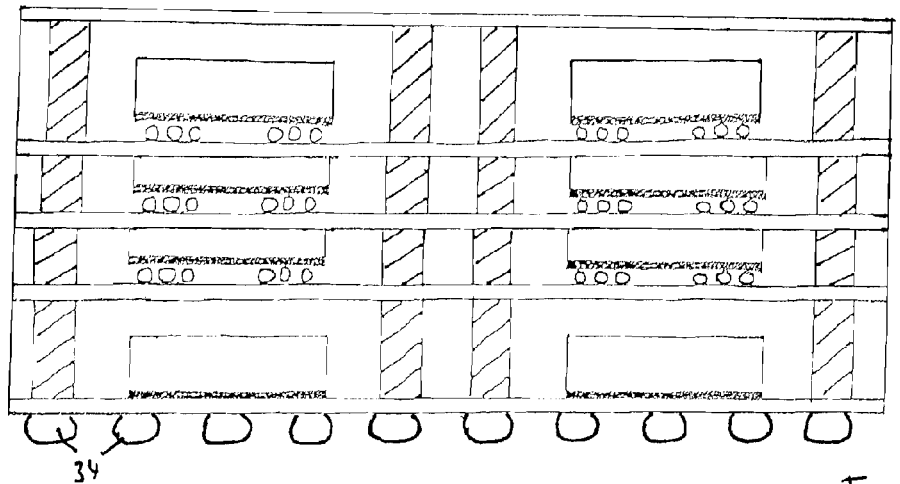
Figure 3N:
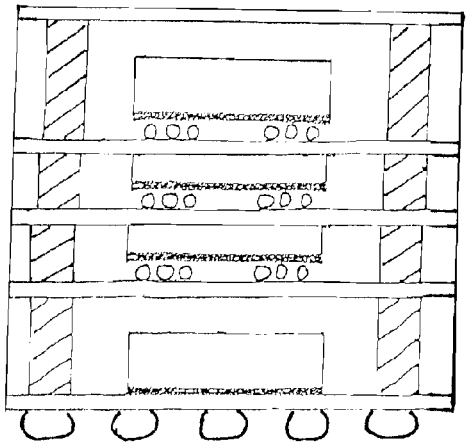
Figure 3N:
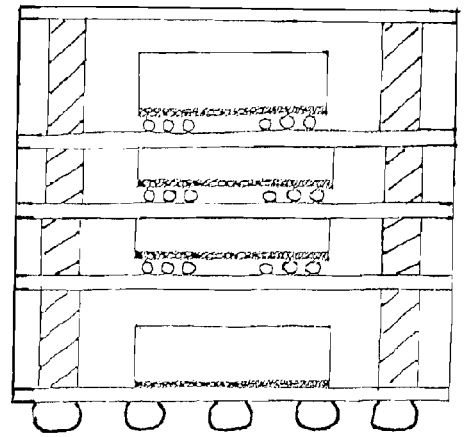

FIGS. 3A to 3N schematically illustrate a method for production of devices 300, cross sections of which are illustrated in FIG. 3N. The method illustrated in FIGS. 3A to 3N is a development of the method illustrated in FIGS. 2A to 2N. The fabrication processes illustrated in FIGS. 3A to 3E are in principle identical or similar to the fabrication processes illustrated in FIGS. 2A to 2E. Therefore, like reference numerals are utilized to refer to like elements in FIGS. 2A to 2E and FIGS. 3A to 3E.

In the fabrication process illustrated in FIG. 3F, the fabrication method of FIG. 3 differs from the fabrication method of FIG. 2. According to FIG. 3F, a redistribution layer 35 is placed over the surface of the first layer 7 of mold material opposite to the surface where the redistribution layer 16 is arranged.

After the fabrication of the redistribution layer 35, the semiconductor chips 4 and 5 may be mounted onto the redistribution layer 35 with their active main surfaces 25 and 26 facing towards the redistribution layer 35 (see FIG. 3G).

The manufacturing of the second layer 8 of mold material (see FIG. 3H), the thinning of the second layer 8 of mold material and the semiconductor chips 4 and 5 (see FIG. 3I), the formation of the through-connections 28 and the redistribution layer 29 (see FIG. 3J), the stacking of the layers 30 and 31 (see FIGS. 3K and 3L), the placement of the solder deposits (see FIG. 3M) as well as the division of the mold material and the redistribution layers (see FIG. 3N) correspond to the fabrication of the devices 200 illustrated in FIGS. 2G to 2K, 2M and 2N.

In case of the device 300, the first layer 7 of mold material may not be thinned. If, however, the first layer 7 of mold material is thinned, this is carried out before the redistribution layer 35 is attached to the first layer 7 of mold material (see FIG. 3F). When the redistribution layer 35 is attached to the first layer 7 of mold material, the first layer 7 of mold material may have a thickness in the range from 300 to 1000 μm.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   providing an array of first semiconductor chips;
   placing the array of the first semiconductor chips over a carrier;
   covering the array of the first semiconductor chips with a mold material after placing the array of the first semiconductor chips over the carrier;
   placing an array of second semiconductor chips over the array of the first semiconductor chips;
   reducing the thicknesses of the second semiconductor chips; and
   singulating the array of the first semiconductor chips by dividing the mold material.

2. The method of claim 1, comprising covering the array of the second semiconductor chips with the mold material before the thicknesses of the second semiconductor chips are reduced.

3. The method of claim 1, comprising placing an array of third semiconductor chips and further arrays of further semiconductor chips sequentially over the array of the second semiconductor chips.

4. The method of claim 3, comprising reducing the thicknesses of the third semiconductor chips.

5. The method of claim 1, comprising forming a through-connection in the mold material covering the array of the first semiconductor chips.

6. The method of claim 1, comprising wherein a first surface of the mold material and a first surface of the first semiconductor chips form a first planar surface and a first electrically conductive layer is applied to the first planar surface.

7. The method of claim 6, comprising applying a second electrically conductive layer to a second surface of the mold material which is opposite to the first surface of the mold material.

8. The method of claim 7, comprising wherein the through-connection electrically connects the first electrically conductive layer to the second electrically conductive layer.

9. The method of claim 1, comprising wherein active main surfaces of the second semiconductor chips face towards active main surfaces of the first semiconductor chips when the array of the second semiconductor chips is placed over the array if the first semiconductor chips.

10. The method of claim 1, comprising reducing the thicknesses of the first semiconductor chips.

11. The method of claim 1, comprising testing semiconductor chips of an array before placing a further array of semiconductor chips over the tested semiconductor chips.

12. The method of claim 11, comprising wherein, if one of the tested semiconductor chips is defective, one of the semiconductor chips placed over the tested semiconductor chips is identical to the defective semiconductor chip.

13. The method of claim 11, comprising wherein, if one of the tested semiconductor chips is defective, no further semiconductor chip is placed over the defective semiconductor chip.

14. A device, comprising:
    a first semiconductor chip;
    a first layer of mold material holding the first semiconductor chip;
    a second semiconductor chip applied over the first layer of mold material; and
    a second layer of mold material holding the second semiconductor chip,
    wherein a first main surface of the second semiconductor chip opposite an active main surface of the second semiconductor chip and facing away from the first semiconductor chip is flush with a first surface of the second layer of mold material; and
    wherein an active main surface of the first semiconductor chip is flush with a first surface of the first layer of mold material.

15. The device of claim 14, comprising wherein the active main surface of the first semiconductor chip faces towards the second semiconductor chip.

16. The device of claim 15, comprising wherein a first electrically conductive layer is applied to the first main surface of the first semiconductor chip and the first surface of the first layer of mold material.

17. The device of claim 16, comprising wherein the first electrically conductive layer is arranged between the first layer of mold material and the second layer of mold material.

18. The device of claim 16, comprising wherein a second electrically conductive layer is applied to a second surface of the first layer of mold material.

19. The device of claim 18, comprising wherein a through-connection is arranged in the first layer of mold material connecting the first electrically conductive layer to the second electrically conductive layer.

20. The device of claim 14, comprising wherein the first semiconductor chip and/or the second semiconductor chip have a thickness of less than 200 μm.

21. The device of claim 14, comprising further comprising a third semiconductor chip applied over the second semiconductor chip and in particular one or more further semiconductor chips applied over the third semiconductor chip.

22. A method, comprising:
providing a first semiconductor chip and a second semiconductor chip;
placing the first and second semiconductor chips over a carrier and then covering the first semiconductor chip and the second semiconductor chip with a mold material;
removing the carrier after covering the first semiconductor chip and the second semiconductor chip with the mold material;
removing the mold material until the thicknesses of the first and second semiconductor chips are reduced; and
separating the first semiconductor chip and the second semiconductor chip by dividing the mold material.

23. A method, comprising:
providing an array of first semiconductor chips;
covering the array of the first semiconductor chips with a mold material;
testing semiconductor chips of an array of second semiconductor chips;
placing the array of the second semiconductor chips over the array of the first semiconductor chips after testing the semiconductor chips of the array of second semiconductor chips;
reducing the thicknesses of the second semiconductor chips; and
singulating the array of the first semiconductor chips by dividing the mold material.

24. The method of claim 23, comprising placing the array of the first semiconductor chips over a carrier before covering the array of the first semiconductor chips with the mold material.

25. The method of claim 24, comprising removing the carrier after covering the array of the first semiconductor chips with the mold material.

26. A method, comprising:
providing an array of first semiconductor chips;
covering the array of the first semiconductor chips with a mold material;
placing an array of second semiconductor chips over the array of the first semiconductor chips;
covering the array of the second semiconductor chips with the mold material, and thereafter;
partially removing the mold material to form through holes in the mold material covering the covering the array of the second semiconductor chips;
reducing the thicknesses of the second semiconductor chips; and
singulating the array of the first semiconductor chips by dividing the mold material.

27. The method of claim 26, comprising wherein the first and second semiconductor chips are placed over a carrier before they are covered with the mold material and the carrier is removed after covering the first and second semiconductor chips with the mold material.

* * * * *

UNITED STATES PATENT AND TRADEMARK OFFICE
CERTIFICATE OF CORRECTION

| | | |
|---|---|---|
| PATENT NO. | : 7,858,440 B2 | Page 1 of 1 |
| APPLICATION NO. | : 11/859346 | |
| DATED | : December 28, 2010 | |
| INVENTOR(S) | : Pressel et al. | |

It is certified that error appears in the above-identified patent and that said Letters Patent is hereby corrected as shown below:

Column 12, line 21, delete second occurrence of "covering the".

Signed and Sealed this
Nineteenth Day of April, 2011

David J. Kappos
*Director of the United States Patent and Trademark Office*